United States Patent
Kamamori et al.

(10) Patent No.: US 8,933,386 B2
(45) Date of Patent: Jan. 13, 2015

(54) OPTICAL SENSOR DEVICE AND METHOD OF MANUFACTURING THE SAME

(71) Applicant: Seiko Instruments Inc., Chiba (JP)

(72) Inventors: Hitoshi Kamamori, Chiba (JP); Sadao Oku, Chiba (JP); Hiroyuki Fujita, Chiba (JP); Koji Tsukagoshi, Chiba (JP); Keiichiro Hayashi, Chiba (JP)

(73) Assignee: Seiko Instruments Inc. (JP)

( * ) Notice: Subject to any disclaimer, the term of this patent is extended or adjusted under 35 U.S.C. 154(b) by 239 days.

(21) Appl. No.: 13/669,858

(22) Filed: Nov. 6, 2012

(65) Prior Publication Data

US 2013/0134300 A1    May 30, 2013

(30) Foreign Application Priority Data

Nov. 10, 2011    (JP) ................................. 2011-246671

(51) Int. Cl.
*G01J 1/42* (2006.01)
*H01L 31/0203* (2014.01)

(52) U.S. Cl.
CPC ............... *G01J 1/42* (2013.01); *H01L 31/0203* (2013.01); *H01L 2224/48091* (2013.01); *H01L 2224/73265* (2013.01); *H01L 2224/45147* (2013.01); *H01L 2924/3025* (2013.01)
USPC .......................................................... 250/216

(58) Field of Classification Search
USPC .......... 250/216, 239, 208.1; 310/344; 385/93; 257/671–676
See application file for complete search history.

(56) References Cited

U.S. PATENT DOCUMENTS

| | | | |
|---|---|---|---|
| 2009/0059055 A1* | 3/2009 | Nakano et al. ................. | 348/340 |
| 2009/0283847 A1* | 11/2009 | Kawasaki et al. .............. | 257/432 |
| 2010/0155962 A1* | 6/2010 | Inoue et al. .................... | 257/774 |
| 2010/0308695 A1* | 12/2010 | Numata et al. ................. | 310/344 |

FOREIGN PATENT DOCUMENTS

| | | |
|---|---|---|
| JP | 61214565 | 9/1986 |
| JP | 2006013264 | 1/2006 |
| JP | 2007036264 | 2/2007 |

* cited by examiner

*Primary Examiner* — Seung C Sohn
(74) *Attorney, Agent, or Firm* — Adam & Wilks

(57) ABSTRACT

Provided is a high-reliability, compact, and low-cost optical sensor device. The optical sensor device includes a glass lid substrate (2), a glass substrate (9) with a cavity having divided and exposed through-hole electrodes (5) on the periphery thereof, and an optical sensor element (3) mounted on the glass lid substrate, and has a structure in which the glass lid substrate and the glass substrate with a cavity are bonded together. By hermetically sealing with the glass substrates, high reliability is secured. By using the divided through-hole electrodes, the package size is reduced and the number of devices which can be produced in a batch in the manufacture increases, which enables cost reduction.

7 Claims, 6 Drawing Sheets

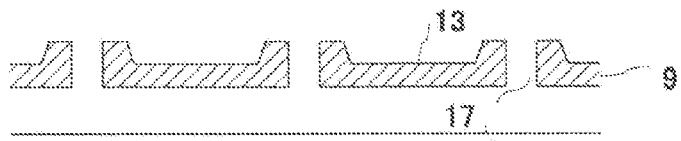
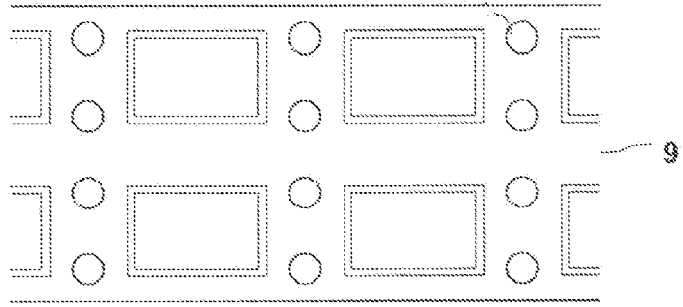
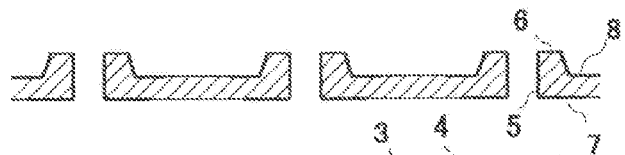
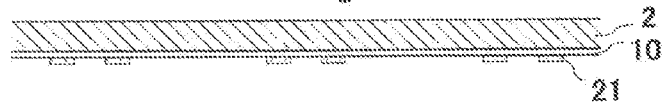
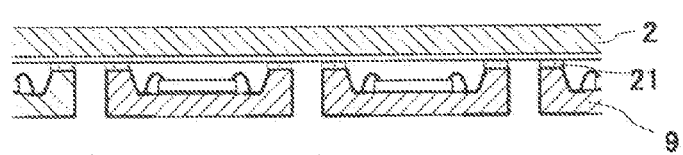
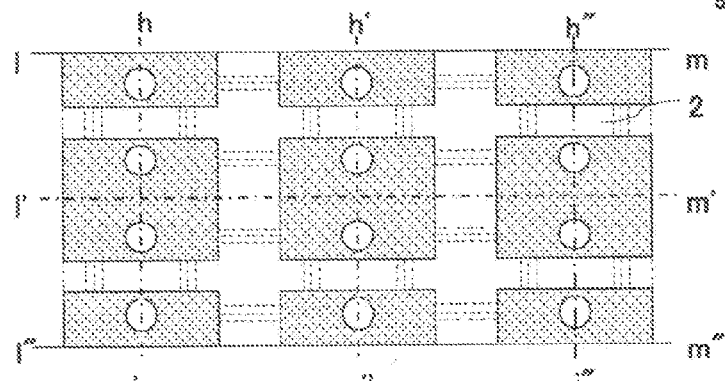

OPTICAL SENSOR DEVICE AND METHOD OF MANUFACTURING THE SAME

BACKGROUND OF THE INVENTION

1. Field of the Invention

The present invention relates to an optical sensor device in which, an optical sensor element is mounted on a package material using a glass substrate.

2. Description of the Related Art

In recent years, mobile terminals such as mobile personal computers, tablet personal computers, and smartphones ere rapidly becoming widespread. This is because those mobile terminals have a large number of functions and another main reason is that they are designed to promote portability such as light in weight and thin in thickness. On the other hand, the number of electronic parts need in mobile terminals is numerous along with the pursuit of multi-functionality and portability, and further reduction in size, thickness, and cost and power saving are now always required. As a result, a resin mold package has been widely adopted for electronic parts. An optical sensor, which is one of electronic parts mounted in mobile terminals responsible for reducing power consumption is not exceptional. Similarly to other electronic parts, many products aimed at reducing the size, thickness, and cost by a resin mold package have been developed.

FIG. 6 is a cross-sectional view of an illuminance sensor package which is an electronic part disclosed in Japanese Published Patent Application No. 2007-36264 in which a light receiving element is mounted on an insinuating substrate made of a resin material and is molded by a resin. An electrode 22 is formed on the front surface of a resin substrate 20. The electrode 22 is wired so as to surround the rear surface of the substrate thereby being connectable to the outside. An electrode 23 has en optical sensor element 21 mounted thereon. A top surface 21a of the optical sensor element 21 and an electrode 24 are electrically connected via a wire 26. The optical sensor element 21 is firmly fixed onto the electrode 23 by a conductive paste 25. The conductive paste 25 electrically connects the optical sensor element 21 and the electrode 24 to each other.

In FIG. 6, the optical sensor element 21 is molded by a resin 2 as a whole. The resin 27 is made of a translucent resin, and an epoxy resin or the like is used. An infrared absorbing film 28 is provided on the resin 27. The infrared absorbing film 28 uses a resin and has a structure in which a liquid resin or a film, is adhered and laminated on the resin 27. As the liquid resin, an epoxy resin or the like is used. In the case of using a film, a film is adhered on the resin 2 via a resin adhesive. The optical sensor element 21 can thus receive visible light from which infrared tight has been filtered, thereby serving as an optical sensor corresponding to the visibility. Such infrared absorbing effect can also be obtained even when an infrared absorbing substance used for the infrared absorbing film 28 is dispersed and mixed in the translucent resin 27.

However, the optical sensor device described in Japanese Published Patent Application No. 2007-36264 has a package structure in which an epoxy resin or the like is need for sealing the element, and hence has a problem such as weak in environmental reliability including heat resistance and moisture resistance of the material. In particular, a resin or a film forcing the infrared absorbing film is thin and weak against heat and moisture.

Further, in the optical sensor device described in Japanese Published Patent Application No. 2007-36264, as the infrared absorbing film for obtaining intended characteristics a resin such as an epoxy resin is used as an example. In the case of using an epoxy resin or the like as the infrared absorbing film, the resin may be dissolved by moisture or heat. As a result, there is a problem that the infrared light as an absorption target cannot be absorbed and desired characteristics cannot be obtained progressively.

In light of the foregoing, some of electronic parts which use glass as a package material have been commercially available. The glass material prevents moisture and contaminants from entering from outside and is also high in airtightness. The glass material has a coefficient of thermal expansion approximate to that of a silicon substrate forming a semiconductor element, and hence when the semiconductor element is mounted on a glass package, the reliability of amounting surface or a bonding surface can be enhanced. In addition, the glass material is inexpensive, and hence the increase in manufacturing cost can be suppressed.

FIG. 7 is a cross-sectional view of an illuminance sensor package which is an electronic pert disclosed in Japanese Published Patent Application No. 61-214565 in which an optical sensor element is mounted on a substrate made of a ceramic material and is hermetically sealed by an insulating frame and a transparent glass plate. On the front and rear surfaces of a ceramic substrate 31, wiring patterns 32 and 39 are provided by metallization, respectively, and are electrically corrected to each other via a through electrode 38. An optical sensor element 33 is mounted on the substrate 31, and she top surface of the optical sensor element 33 and the wiring pattern 32 provided on the front surface of the substrate are electrically connected to each other via a wire 34. On the substrate 31, an insulating frame 35 is fixed via an adhesive 36 so as to surround the outside of the portion at which the wire 34 is connected to the wiring pattern 32. Transparent glass 37 is further adhered on the upper end of the insulating frame 35 by the adhesive 36.

The optical sensor element 33 is in a hollow state surrounded by the insulating frame 35 and the transparent glass 37. This is a structure in which the element and the wire are free from stress, which is often a problem to be solved in a structure sealed by a resin mold. External light enters the top surface of the optical sensor element 33 through the transparent glass 37 to generate an electro motive force. The electro motive force generated by the optical sensor element 33 is transferred from the wire 34 through the wiring pattern 32 and the through electrode 38 to a wiring pattern 39 provided on the rear surface side of the substrate 31. The substrate 31 is not a multilayer but a single layer of the ceramic material and, as the substrate material, a glass epoxy resin or the like is used as well as ceramic. Thus, the cost of the package is reduced.

The optical sensor device described in Japanese Published Patent Application No. 61-214565 does not use a resin which is used in the above-mentioned optical sensor device described in Japanese Published Patent Application No. 2007-36264, but mainly uses a high-reliability material such as ceramic and glass. This can eliminate a weak portion, which is a problem inherent in the resin material. However, the optical sensor device described in Japanese Published Patent application No. 61-214565 needs to be assembled with the use of different materials and parts such as the substrate, the insulating frame, and the transparent glass, and hence it is difficult to reduce the cost of the package. Further, the materials of the main components of the package, including the substrate, the insulating frame, and the transparent glass, have significantly different coefficients of expansion. Accordingly, under a temperature cycle test environment repeating high temperature and low temperature, the package is susceptible to damage due to stress generated by the difference in coefficient of expansion.

In the optical sensor device described in Japanese Published Patent application No. 61-214565, the optical sensor element 33 is surrounded by the insulating frame 35, and hence an area of the insulating frame 35 and further, a space for providing the through electrode 30 to the outside of the insulating frame 35 are required, causing a problem that reduction in size of the package is difficult.

FIG. 8 is a cross-sectional view of an optical semiconductor device which is an electronic part disclosed in Japanese Published Patent application No. 2006-13264 in which an optical semiconductor element is mounted on a ceramic substrate having a cavity and hermetically sealed with a transparent lid of glass or the like. A wiring conductor 42 and the cavity can be formed in a ceramic substrate 41 by laminating a green sheet punched in the shape of a frame, a green sheet having metal paste printed thereon, a green sheet having filled through-holes and the like. A transparent lid 45 has a plurality of holes 45a on the periphery thereof, and is bonded to the ceramic substrate 41 with a bonding agent 47 filled in the holes 45a.

The optical semiconductor device described in Japanese Published Patent Application No. 2006-13264 does not nave an insulating frame as described in Japanese Published Patent Application No. 61-214565 and is formed of only ceramic and glass, and thus, high reliability is espoused. A ceramic substrate requires, however, a large number of steps such as punching and lamination of green sheets having metal paste printed thereon/fulfilled therein, and in addition, requires high heat treatment, which results in high manufacturing cost. Further, an area for the wiring conductor 42 is required to be secured, and thus, reduction in size of the package becomes difficult and the number of devices which can be produced in a batch becomes small, which cause a problem of further increase in the cost.

SUMMARY OF THE INVENTION

According to an exemplary embodiment of the present invention, there is provided an optical sensor device including: a glass lid substrate; a glass substrate with a cavity; and an optical sensor element mounted on any one of the glass lid substrate and the glass substrate with a cavity having divided and exposed through-hole electrodes on a periphery thereof, in which the glass lid substrate and the glass substrate with a cavity are bonded together.

Further, the divided and exposed through-hole electrode is provided at a corner portion of the glass substrate with a cavity.

Still further, the divided and exposed through-hole electrodes are provided at two opposite peripheral edges.

Yet further, light shielding glass is used as the glass substrate with a cavity.

Yet further, glass having a filter function is used as the glass lid substrate.

Yet further, a method of manufacturing an optical sensor device includes; forming a conductive film on a glass substrate, the glass substrate having a plurality of cavities and a plurality of through-holes on a periphery of the plurality of cavities; patterning the conductive film in a predetermined shape; mounting an optical sensor element on the patterned conductive film; bonding with an adhesive a glass lid substrate and the substrate with the cavities together; and cutting the bonded glass substrate at locations dividing the plurality of through-holes.

Yet further, a method of manufacturing an optical sensor device includes: forming a conductive film on one surface of a glass lid substrate; patterning the conductive film in a predetermined shape; mounting an optical sensor element on the patterned conductive film; forming a conductive film on a glass substrate, the glass substrate having a plurality of cavities and a plurality of through-holes on a periphery of the plurality of cavities; patterning the conductive film in a predetermined shape; bonding the glass lid substrate and the substrate with the cavities together, with an adhesive having conductive particles added thereto; and cutting the bonded glass substrate at locations dividing the plurality of through-holes.

Yet further, the cutting the glass substrate includes dicing.

Yet further, the cutting of the glass substrate includes ultrasonic cutting.

According to the optical sensor device of the present invention, the optical sensor element can be completely hermetically sealed with glass, and further, the package structure is only formed of a glass material. Thus, there is no difference in coefficient of expansion, and a very high-reliability package can be obtained. Further, by using the divided and exposed through-hole electrodes, the package size can be reduced and the number of devices which can be produced in a batch increases, which enables cost reduction. An optical sensor device which is excellent both in cost and reliability can thereby be provided.

BRIEF DESCRIPTION OF THE DRAWINGS

In the accompanying drawings:

FIGS. 4A to 4I are plan views and cross-sectional views schematically illustrating manufacturing process steps of an optical sensor device of the present invention;

DETAILED DESCRIPTION OF THE PREFERRED EMBODIMENTS

An optical sensor device of the present invention includes a glass lid substrate, a glass substrate with a cavity having divided and exposed through-hole electrodes on the periphery thereof, and an optical sensor element mounted on any one of the substrates, and the optical sensor device has a structure in which the glass lid substrate and the glass substrate with a cavity are bonded together.

First Embodiment

The structure of an optical sensor device according to this embodiment is hereinafter described with reference to the drawings.

Figure 1A:
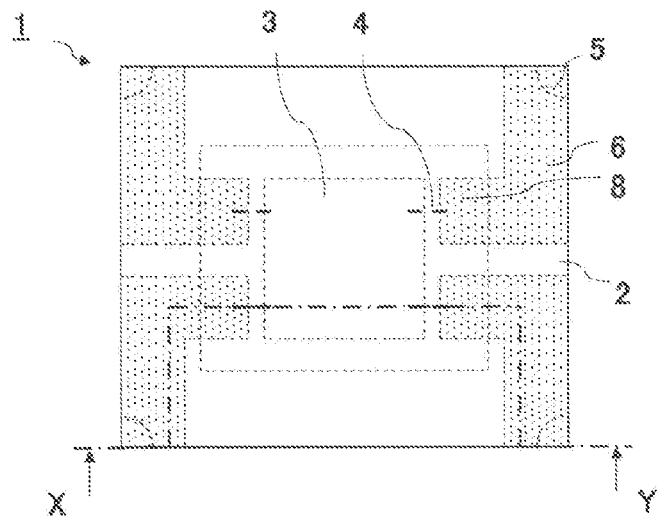
FIGS. 1A, 1B, and 1C are a plan view, a cross-sectional view, and a bottom view, respectively, which schematically illustrate a structure of an optical sensor device of the present invention.
Figure 1B:
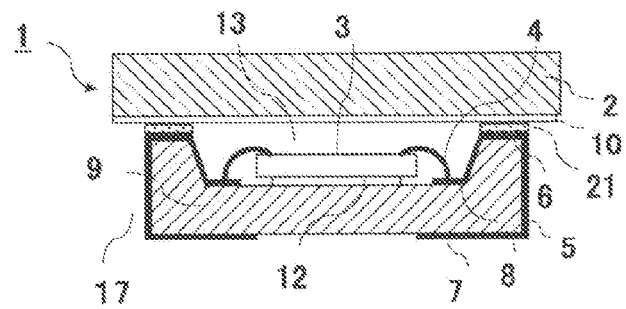
Figure 1C:
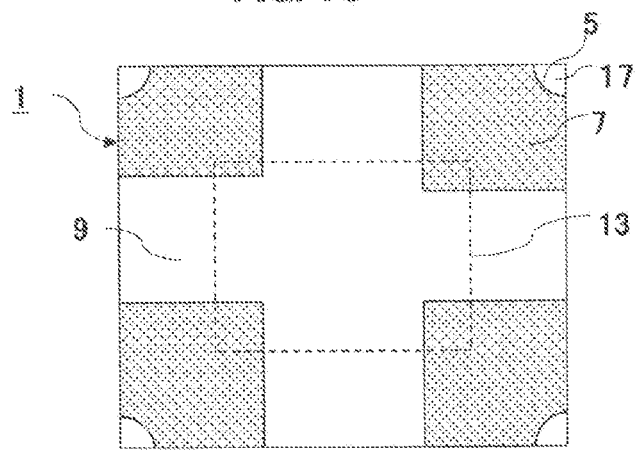

FIGS. 1A, 1B, and 1C are a plan view, a cross-sectional view taken along the dashed line X-Y of FIG. 1A, and a bottom view, respectively, which schematically illustrate this embodiment.

A glass substrate 2 (hereinafter referred to as glass lid substrate 2) in FIG. 1B is provided wish an optical filter 10 having properties conformable to the sensor. For example, in the case of an illuminance sensor, an optical filter conformable to a corrected luminosity curve is used, and, by forming on the glass substrate a metal oxide multilayer firm in which the layers have different refractive indices or by applying a coating of a resin with a pigment added thereto on the glass substrate, the optical filter function can be obtained. Further, if the glass substrate 2 by itself is caused to have the filter function by using, for example, phosphate-based glass, the filter 10 can be eliminated.

A glass substrate 9 (hereinafter referred to as cavity substrate 9) includes a cavity 13, and divided-into-four through-holes 17 at the respective corners. The through-holes each include a through-hole electrode 5. Electrodes 8 for mounting are provided in the cavity while external electrodes 7 for connection are provided on a surface opposite to the cavity. These electrodes are connected to each other via wiring electrodes 6. An exemplary shape of the external, electrodes 7 is illustrated in FIG. 1C, and exemplary shapes of the electrodes 8 for mounting and the wiring electrodes 6 are illustrated in FIG. 1A, but the shapes are not specifically limited insofar as the electrodes 5 to 8 are electrically continuous. Further, FIGS. 1A to 1C illustrate the case of a four-terminal sensor. In the case of a three-terminal sensor, an electrode at any one of the corners can be eliminated. In the case of a five-or-more-terminal sensor, a divided-into-two through-hole electrode may be additionally provided at any one of the edges.

An optical sensor element 3 is fixed, with a die bonding agent 12 to the cavity 13 in the cavity substrate 9 in FIG. 1B. The optical sensor element 3 and the electrodes 8 for mounting are electrically continuous via wires 4.

The glass lid substrate 2 and the cavity substrate 9 are bonded together via an adhesive 21 as illustrated in FIG. 1B. The adhesive used may be any one of a thermosetting type, a UV-curable type, and a UV-curable and thermosetting type.

The optical sensor element 3 surrounded by the glass lid substrate 2 and the cavity substrate 9 can be maintained in a hermetically sealed hollow state. As a result, in the optical sensor element 3, the element is tree from stress caused by, for example, a structure sealed by a resin mold, and the reliability can thereby be enhanced.

Further, the divided through-hole electrodes are used, and thus, the package size can be reduced and the package cost can be reduced.

Second Embodiment

Figure 2A:
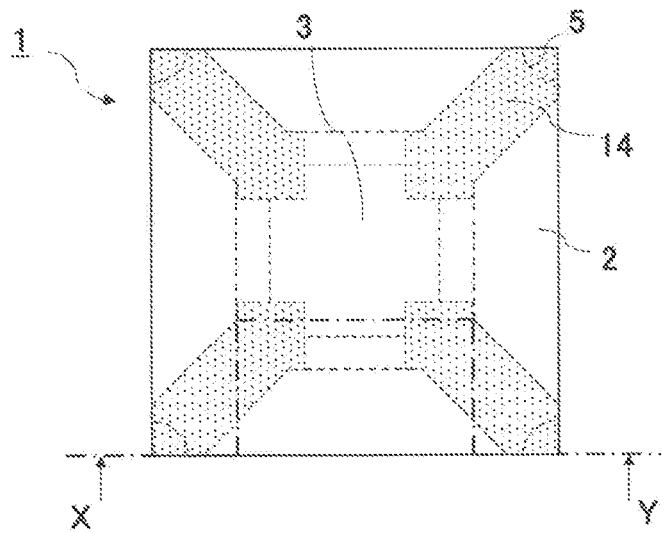
FIGS. 2A, 2B, and 2C are a plan view, a cross-sectional view, and a bottom view, respectively, which schematically illustrate a structure of another optical sensor device of the present invention.
Figure 2B:
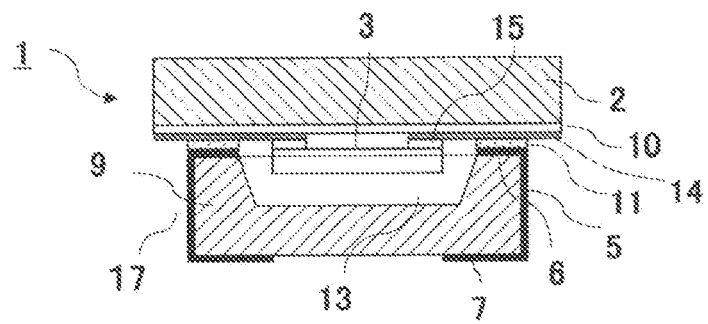
Figure 2C:
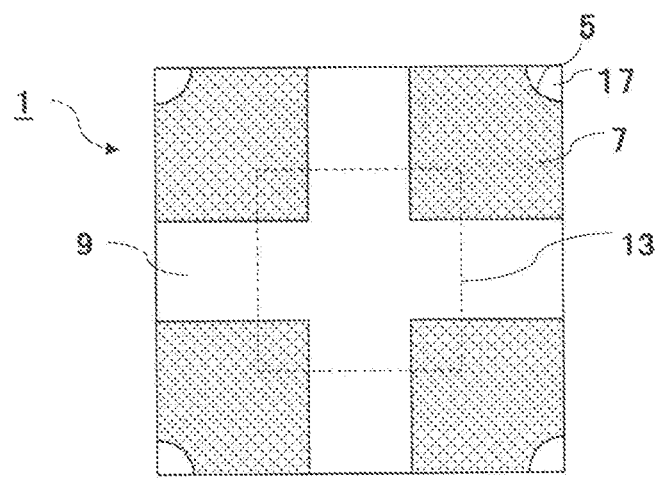

FIGS. 2A, 2B, and 2C are a plan view, a cross-sectional view taken along the dashed line X-Y of FIG. 2A, and a bottom view, respectively, which schematically illustrate this embodiment.

The glass substrate 2 (hereinafter referred to as glass lid substrate 2) illustrated in FIG. 2B includes the optical filter 10 and electrodes 14 for mounting. The optical sensor element 3 is flip-chip bonded to the electrodes 14 for mounting via, for example, Au bumps 15. The shape of the electrodes 14 for mounting is illustrated in FIG. 2A, but is not limited to the illustration insofar as the shape connects the flip-chip bonded portions of the sensor element and the wiring electrodes 6 of the glass substrate 9.

The glass substrate 9 (hereinafter referred to as cavity substrate 9) includes the cavity 13, and the divided-into-four through-holes 17 at the respective corners. The through-holes each include the through-hole electrode 5. The wiring electrodes 6 are provided on she cavity surface side while the external electrodes 7 for connection are provided on a surface opposite to the cavity. An exemplary shape of the external electrodes 7 is illustrated in FIG. 2C, and exemplary shapes of the electrodes 14 for mounting, the wiring electrodes 6, and the through-hole electrodes 5 are illustrated in FIG. 2A, but the shapes are not specifically limited insofar as the electrodes 5 to 7 are electrically continuous. Further, FIGS. 2A to 2C illustrate the case of a four-terminal sensor. In the ease of a three-terminal sensor, an electrode at any one of the corners can be eliminated. In the case of a five-or-more-terminal sensor, a divided-into-two through-hole electrode may be additionally provided at any one of the edges.

As illustrated in FIG. 2B, the glass lid substrate 2 and the cavity substrate 9 are bonded together via an adhesive 11 with conductive particles added thereto. The electrodes 14 for mounting and the wiring electrodes 6 are electrically connected to each other, respectively, via conductive particles in the adhesive 11. The adhesives used may be any one of a thermosetting type, a UV-curable type, and a UV-curable and thermosetting type.

Similarly to the case of the first embodiment, the optical sensor element 3 surrounded by the glass lid substrate 2 and the cavity substrate 9 can be maintained in a hermetically sealed hollow state, and thus, a high-reliability optical sensor device can be provided.

Further, in this embodiment mounting by flip-chip bonding is used, and thus, a wire bending area is unnecessary. This can, together with the use of the divided through-hole electrodes, further reduce the package size, and can further reduce the package cost.

Third Embodiment

Figure 3A:
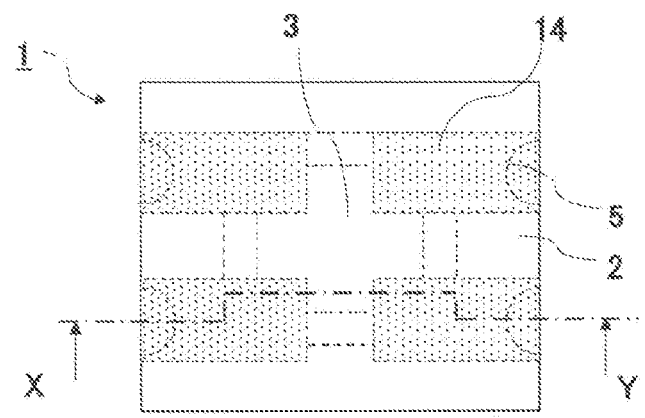
FIGS. 3A, 3B, and 3C are a plan view, a cross-sectional view, and a bottom view, respectively, which schematically illustrate a structure of still another optical sensor device of the present invention.
Figure 3B:
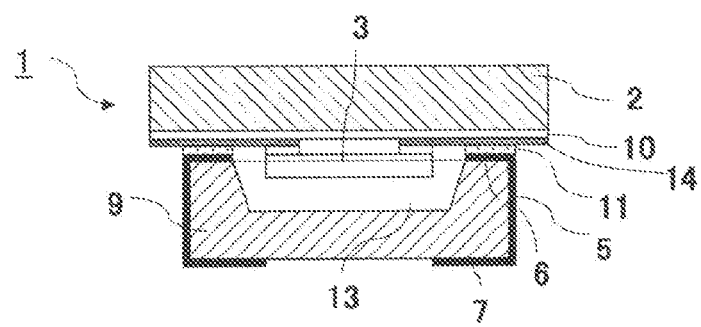
Figure 3C:
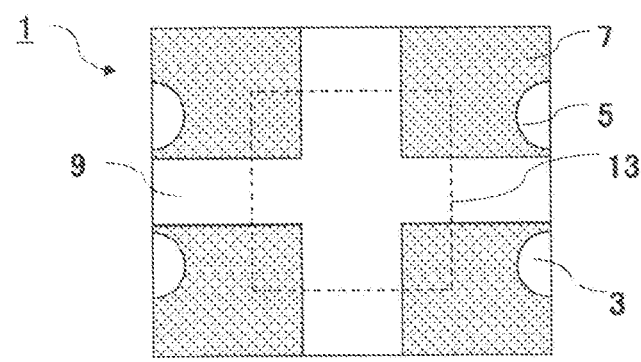

FIGS. 3A, 3B, and 3C are a plan view, a cross-sectional view taken along the dashed line X-Y of FIG. 3A, and a bottom view, respectively, which schematically illustrate this embodiment.

The glass substrate 2 (hereinafter referred to as glass lid substrate 2) illustrated in FIG. 3B includes the optical filter 10 and the electrodes 14 for mounting. The optical sensor element 3 is flip-chip bonded to the electrodes 14 for mounting via, for example, Au bumps.

The glass substrate 9 (hereinafter referred to as cavity substrate 9) includes the cavity 13, and divided-into-two through-holes 17 at the two opposite edges. The through-holes each include the through-hole electrode 5. The wiring electrodes 6 are provided on the cavity surface side while the external electrodes 7 for connection are provided on a surface opposite to the cavity. An exemplary shape of the external electrodes 7 is illustrated in FIG. 3C, and exemplary shapes of the electrodes 14 for mounting, the wiring electrodes 6, and the through-hole electrodes 5 are illustrated in FIG. 3A, but the shapes are not specifically limited insofar as the electrodes 5 so 7 are electrically continuous. Further, FIGS. 3A to 3C illustrate the case of a tour-terminal sensor. In the case of a three-terminal sensor, any one of the through-hole electrodes can be eliminated. In the case of a five-or-more-terminal sensor, a divided-into-two through-hole electrode may be additionally provided at any one of the edges.

As illustrated in FIG. 3B, the glass lid substrate 2 and the cavity substrate 9 are bonded together via the adhesive 11 with conductive particles added thereto. The electrodes if for mounting and the wiring electrode 6 are electrically connected to each other, respectively, via conductive particles in the adhesive 11.

In this embodiment, by providing the divided-into-two through-hole electrodes at the two opposite edges, the areas including edges without the through-hole electrodes can be minimised, and the package cost can be further reduced by further reducing the size.

Fourth Embodiment

FIGS. 4A to 4I are cross-sectional views and plan views schematically illustrating manufacturing process steps of an optical sensor device of this embodiment.

<Shaping Process>

FIGS. 4A and 4B are cross-sectional views and FIG. 4B' is a plan view which illustrate a shaping process.

A glass substrate illustrated in FIG. 4A is processed to form the cavity substrate 9 having the cavity 13 and the through-holes 17 illustrated in FIGS. 4B and 4B'. As the method of the processing, so-called shaping in which glass is softened under high temperature and is then shaped to have a predetermined shape, sandblasting, drilling, or the like may be used. From the viewpoint of the cost, shaping is desired, but a plurality of methods may be used in combination in which, for example, the cavity is formed by shaping while the through-holes are formed by drilling.

<Conductive Film Forming Process>

FIG. 4C illustrates a state in which a conductive film 16 is formed on the cavity substrate 9. Plating, sputtering, or the like may be used to form the film; plating is preferred from the viewpoint of the cost and the film formability in the through-holes 17. In the plating, generally, after a rough surface treatment of the glass, activation of catalyst, and the like, non-electroplating Ni is applied as base plating, and an Au film or the like is formed thereon by electroplating.

<Patterning Process>

FIG. 1D illustrates a state in which the conductive film 16 is patterned to define the through-hole electrodes 5, the wiring electrodes 6, the external electrodes 7, and the electrodes 14 for mounting. The patterning is carried out by leaving by photolithography a resist film in regions in which the electrodes are required to be left, and then etching the electrodes. When patterning on a bottom surface of the cavity is difficult, it is also possible to form the conductive film by applying a nanometal ink by an ink jet method in a predetermined shape and then burning the ink.

<Element Mounting Process>

FIG. 4E illustrates a state in which the optical sensor element 3 is die-bonded to the bottom surface of the cavity, and then, electrodes of the optical sensor element and the electrodes 14 for mounting are wire bonded via the wires 4. The wire bonding can use wires of Au, Al, and Cu.

<Bonding Process>

FIG. 4F illustrates a state in which the adhesive 11 is applied to the glass lid substrate 2 having the optical filter 10. As the method of the application, screen printing, offset lithography, flexography, application using a dispenser, or the like may be used, and the method can be selected according to the package specifications. Further, as the adhesive 11, an epoxy-based adhesive, an acrylic adhesive, or the like can be used.

FIG. 4G illustrates a state in which the glass lid substrate 2 and the cavity substrate 9 are bonded together. This state can be obtained by aligning the glass lid substrate 2 having the adhesive 11 applied thereto with the cavity substrate 9 and, under pressure, curing the adhesive under high temperature or with UV irradiation.

<Cutting Process>

FIG. 4H is a plan view seen from the cavity substrate 9 side after the bonding. By cutting the cavity substrate 9 along broken lines m-l, m'-l', m"-l", h-i, h'-i', and h"-i", a an optical sensor device 1 illustrated in FIG. 4I can be obtained. As the method of cutting the glass, scribing with a carbide blade, laser cutting, dicing, ultrasonic cutting, or the like may be used, but, according to the present invention, the through-hole portions are required to be cut, and thus, dicing or ultrasonic cutting is desired. Ultrasonic cutting is particularly suitable for cutting glass, can process glass in a shorter time than dicing, and has excellent quality of a cut surface.

According to the manufacturing method or the present invention, the optical sensor element can be mounted in a hollow state which is hermetically sealed with glass in simple process steps, and a high-reliability optical sensor device can be provided which is completely free from stress on an element caused by, for example, a conventional structure sealed by a resin mold. Further, the through-hole electrodes are divided, by cutting, and thus, there is no wasted area. This can, together with reduction in size of the package, maximize the number of packages which can be produced from the substrates, and can realize significant cost reduction.

Further, the divided through-hole electrodes are used, and thus, the package size can be reduced and the package cost can be reduced.

Fifth Embodiment

FIGS. 5A to 5I are cross-sectional views and plan views schematically illustrating manufacturing process steps of another optical sensor device of this embodiment.

<Conductive Film Forming Process>

Figure 5A:
FIGS. 5A to 5I are plan views and cross-sectional views schematically illustrating manufacturing process steps of another optical sensor device of the present invention.

FIG. 5A is a cross-sectional view of the glass lid substrate 2 having the conductive film 16 formed on the optical filter 10 thereof. The conductive film is formed on a flat substrate, and thus, can be formed by any one of plating and a vacuum film forming method such as vapor deposition or sputtering. However, the conductive film is used also as electrodes for flip-chip bonding, and thus, as the conductive film, a multilayer film of Cr+Au, Ni+Au, or the like which is formed by a vacuum film forming method and which is excellent in adherence and flatness is suitable.

<Patterning Process>

Figure 5B:

FIG. 5B is a cross-sectional view of the glass lid substrate 2 having the electrodes 14 for mounting formed thereon by patterning the conductive film 16. By using photolithography in the patterning, the electrodes 14 can be formed with ease. As another method, the conductive film may be formed by applying a nanometal ink by the ink jet method in a predetermined shape and then burning the ink. In this case, the conductive film forming process and the patterning process may be carried out at the same time.

<Element Mounting Process>

Figure 5C:

FIG. 5C illustrates a state in which the optical sensor element 3 is flip-chip bonded to the electrodes 14 for mounting. With regard to the flip-chip bonding, bumps are formed in advance on the optical sensor element, end bonding to the electrodes 14 for mounting can be carried out by the use of heat or ultrasonic waves. As the material of the bumps, Au, solder, or the like stay be used, but the bonding can be carried out also using a resin containing conductive particles, without using the bumps.

<Conductive Film Forming Process>

Figure 5D:

FIG. 5D is a cross-sectional view of the cavity substrate 9 which is formed in processes similar to those of the fourth embodiment and which includes the cavity 13, the through-holes 17, and the conductive film 16.

<Patterning Process>

Figure 5E:
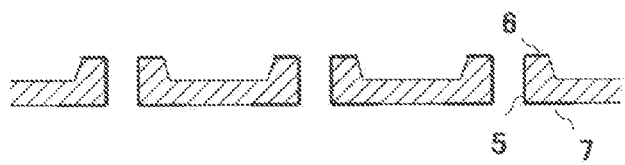

FIG. 5E illustrates a state in which the conductive film 16 is patterned to define the through-hole electrodes 5, the wiring electrodes 6, and the external electrodes 7. The patterning can be carried out similarly to the case of the fourth embodiment.

<Bonding Process>

Figure 5F:

FIG. 5F illustrates a state in which the adhesive 11 is applied to the cavity substrate 9. As the method of the application, the same method as in the fourth embodiment can be adopted, but, in this embodiment, it is necessary to electrically connect the electrodes 14 of the glass lid substrate 2 and the wiring electrodes 6 of the cavity substrate 9, and thus, conductive particles are in advance added to the adhesive. As the conductive particles, metal bails such as Au balls or W balls, or conductive particles formed by plating plastic balls with Ni or Au can be used.

Figure 5G:
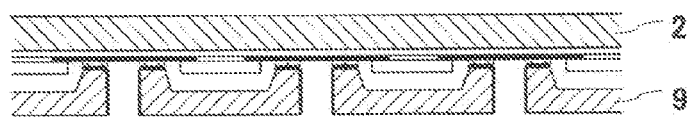

FIG. 5G illustrates a state in which the glass lid substrate 2 and the cavity substrate 9 are bonded together. This state can be obtained by aligning the cavity substrate 9 having the adhesive 11 applied thereto with the glass lid substrate 2 and, under pressure, curing the adhesive under high temperature or with UV irradiation.

<Cutting Process>

Figure 5H:
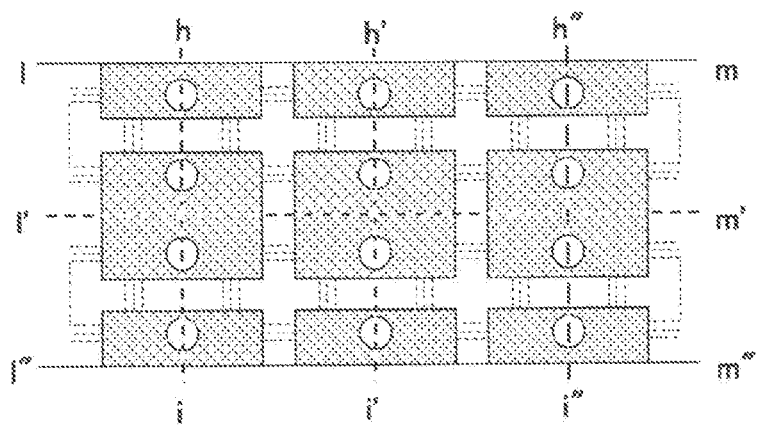
Figure 5I:
Figure 6:
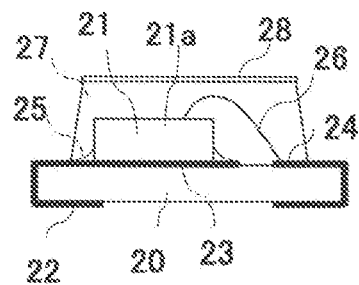
FIG. 6 is a schematic cross-sectional view illustrating a conventionally publicly-known optical sensor device.
Figure 7:
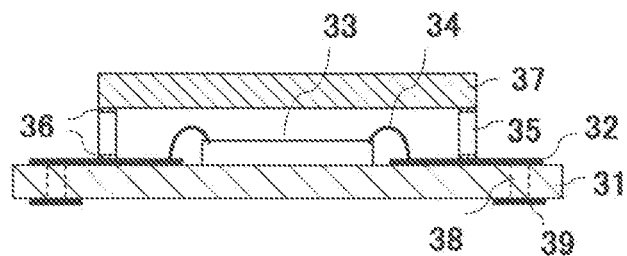
FIG. 7 is a schematic cross-sectional view illustrating a convent locally publicly-known semiconductor optical sensor device.
Figure 8:
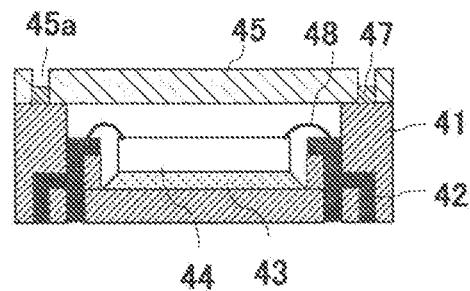
FIG. 8 is a schematic cross-sectional, view illustrating a convent locally publicly-known optical semiconductor device.

FIG. 5H is a plan view seen from the side the glass lid substrate 2 after the bonding. By cutting the glass lid substrate 2 along broken lines m-l, m'-l', m"-l", h-i, h'-i', and h"-i", an optical sensor device 1 illustrated in FIG. 5I can be obtained. As the method of cutting the glass, the same method as in the fourth embodiment can be adopted.

According to the manufacturing method of the present invention, mounting by flip-chip bonding is used, and thus, a wire bonding area is unnecessary. This can, together with the use of the divided through-hole electrodes, further reduce the package size, and can further reduce the package cost.

According to the present invention, an optical sensor device whose element is surrounded by glass having high reliability can be provided at low cost, contributing to the supply of various devices equipped with an optical sensor device, such as mobile terminals and lighting fixtures, which cover the indoor and outdoor applications and the use under a severe environment.

What is claimed is:

1. An optical sensor device, comprising:
   a glass substrate with a cavity;
   a glass lid substrate bonded to the glass substrate with the cavity;
   a through-hole electrode dispose on an outside side surface of the glass substrate with the cavity;
   a wiring electrode connected to the through-hole electrode, and disposed on an upper surface of the glass substrate with the cavity;
   an external, electrode connected to the through-hole electrode, and disposed on a back surface of the glass substrate with the cavity; and
   an optical sensor element mounted on any one of the glass lid substrate and the glass substrate with the cavity.

2. An optical sensor device according to claim 1, wherein the through-hole electrode has a divided-into-four shape and is disposed at a corner of the glass substrate with the cavity.

3. An optical sensor device according to claim 1, wherein the through-hole has a divided-into-two shape and is disposed on each of two opposite edges.

4. An optical sensor device according to claim 1, wherein the glass substrate with a cavity comprises light shielding glass.

5. An optical sensor device according to claim 1, wherein the glass lid substrate has a filter function.

6. A method of manufacturing an optical sensor device, comprising:
   forming a conductive film in a predetermined pattern on a glass substrate, the glass substrate having a plurality of cavities and a plurality of through-holes on a periphery of the plurality of cavities;
   patterning the conductive film in a predetermined shape;
   mounting an optical sensor element on the patterned conductive film;
   bonding with an adhesive a glass lid substrate and the glass substrate together; and
   cutting the glass substrate and the glass lid substrate which are bonded together, at locations dividing the plurality of through-holes.

7. A method of manufacturing an optical sensor device, comprising:
   forming a conductive trim on one surface of a glass lid substrate;
   patterning in a predetermined shape the conductive film formed on the glass lid substrate;
   mounting an optical sensor element on the patterned conductive film;
   forming the conductive film on a glass substrate, the glass substrate having a plurality of cavities and a plurality of through-holes on a periphery or the plurality of cavities;
   patterning in a predetermined shape the conductive film formed on the glass substrate;
   bonding the glass rid substrate and the glass substrate together with an adhesive having conductive particles added thereto; and
   cutting the glass substrate and the glass lid substrate which are bonded together, at locations dividing the plurality of through-holes.

* * * * *